(12) United States Patent
Morfino et al.

(10) Patent No.: US 9,645,217 B2
(45) Date of Patent: May 9, 2017

(54) SYSTEM AND METHOD FOR ERROR CORRECTION FOR CNC MACHINES

(71) Applicant: Fidia S.p.A., San Mauro (IT)

(72) Inventors: Giuseppe Morfino, Pino Torinese (IT); Augusto Mignani, San Mauro Torinese (IT)

(73) Assignee: Fidia S.p.A. (IT)

( * ) Notice: Subject to any disclaimer, the term of this patent is extended or adjusted under 35 U.S.C. 154(b) by 1030 days.

(21) Appl. No.: 13/856,044

(22) Filed: Apr. 3, 2013

(65) Prior Publication Data

US 2013/0268226 A1 Oct. 10, 2013

(30) Foreign Application Priority Data

Apr. 5, 2012 (EP) .................................. 12163426

(51) Int. Cl.
| | |
|---|---|
| *G01C 17/38* | (2006.01) |
| *G01R 35/00* | (2006.01) |
| *B25J 9/16* | (2006.01) |
| *G05B 19/401* | (2006.01) |
| *G01B 21/04* | (2006.01) |
| *G01D 5/244* | (2006.01) |

(52) U.S. Cl.
CPC ............ *G01R 35/00* (2013.01); *B25J 9/1692* (2013.01); *G05B 19/4015* (2013.01); *G01B 21/042* (2013.01); *G01D 5/2448* (2013.01); *G05B 2219/39007* (2013.01); *G05B 2219/39024* (2013.01); *G05B 2219/50026* (2013.01)

(58) Field of Classification Search
None
See application file for complete search history.

(56) References Cited

U.S. PATENT DOCUMENTS

| | | | | |
|---|---|---|---|---|
| 4,818,925 A | * | 4/1989 | Lahm ................. | G05B 19/4015 |
| | | | | 318/565 |
| 4,939,678 A | * | 7/1990 | Beckwith, Jr. ....... | G01B 11/306 |
| | | | | 33/1 M |

(Continued)

FOREIGN PATENT DOCUMENTS

| | | | | |
|---|---|---|---|---|
| CN | 1688949 A | 10/2005 | ........... | G05B 19/404 |
| CN | 101842189 | 9/2010 | ........... | G05B 19/404 |

(Continued)

OTHER PUBLICATIONS

Chinese Patent Office, Chinese Office Action, Application No. 20131016822.3, 14 pages, Jan. 30, 2015.

(Continued)

*Primary Examiner* — Mohamed Charioui
*Assistant Examiner* — Leonard S Liang
(74) *Attorney, Agent, or Firm* — Sunstein Kann Murphy & Timbers LLP

(57) ABSTRACT

A method of determining a positioning error of a CNC machine is provided and an system thereof. A calibration element is placed within the CNC machine. A first sensor reading is taken of the calibration element. A second sensor reading is taken and the sensor is moved in a manner that the difference between the first and second sensor data decreases until the difference becomes less or equal to a pre-determined threshold value. A positioning error of the tool head is determined based on the movement of the sensor.

21 Claims, 5 Drawing Sheets

(56) References Cited

U.S. PATENT DOCUMENTS

| | | | | |
|---|---|---|---|---|
| 5,214,857 A * | 6/1993 | McMurtry | G01B 21/042 | 33/502 |
| 5,266,811 A * | 11/1993 | Matsuura | B23Q 35/128 | 250/559.05 |
| 5,341,079 A * | 8/1994 | Matsuura | B23Q 35/121 | 318/568.19 |
| 5,373,222 A * | 12/1994 | Hemmerle | G01B 11/26 | 318/572 |
| 5,492,440 A * | 2/1996 | Spaan | G05B 19/404 | 318/569 |
| 5,808,888 A * | 9/1998 | Susnjara | G05B 19/423 | 700/195 |
| 5,841,668 A * | 11/1998 | Pahk | G05B 19/404 | 33/503 |
| 6,034,498 A * | 3/2000 | Hamamura | G05B 19/404 | 318/280 |
| 6,065,338 A * | 5/2000 | Stoiber | F16F 15/36 | 318/560 |
| 6,167,634 B1 * | 1/2001 | Pahk | B23Q 11/0007 | 33/503 |
| 6,170,345 B1 * | 1/2001 | Kerner | G01P 21/025 | 702/87 |
| 6,681,145 B1 | 1/2004 | Greenwood et al. | | 700/193 |
| 6,721,675 B1 * | 4/2004 | Chawla | G01B 21/042 | 702/105 |
| 6,850,806 B2 * | 2/2005 | Yutkowitz | G05B 11/28 | 700/37 |
| 7,356,937 B2 * | 4/2008 | Nishibashi | B23Q 1/5462 | 33/502 |
| 8,214,074 B2 * | 7/2012 | Mies | B23Q 15/26 | 700/194 |
| 8,250,952 B2 | 8/2012 | Maxted et al. | | 82/1.11 |
| 8,700,369 B2 * | 4/2014 | Yang | G06F 17/10 | 700/173 |
| 8,978,261 B2 * | 3/2015 | McFarland | G01B 21/045 | 33/503 |
| 2002/0148275 A1 * | 10/2002 | Abbe | G01B 21/042 | 73/1.01 |
| 2003/0009257 A1 * | 1/2003 | Sutherland | G01B 21/042 | 700/195 |
| 2003/0105603 A1 * | 6/2003 | Hardesty | G05B 19/401 | 702/95 |
| 2004/0200085 A1 * | 10/2004 | Sakata | G01B 7/282 | 33/550 |
| 2005/0234671 A1 | 10/2005 | Morfino | | 702/95 |
| 2006/0201010 A1 * | 9/2006 | Maier | B23Q 17/22 | 33/502 |
| 2007/0033819 A1 * | 2/2007 | McFarland | G01B 21/04 | 33/551 |
| 2009/0183610 A1 * | 7/2009 | Maxted | G05B 19/401 | 82/1.11 |
| 2010/0024233 A1 * | 2/2010 | Boland | B23Q 15/22 | 33/628 |
| 2010/0076710 A1 * | 3/2010 | Hukkeri | G01S 7/4004 | 702/97 |
| 2011/0056085 A1 * | 3/2011 | Jordil | G01B 5/008 | 33/503 |
| 2011/0218668 A1 * | 9/2011 | Morfino | G05B 19/401 | 700/174 |
| 2012/0041712 A1 * | 2/2012 | Pettersson | G01B 5/008 | 702/151 |
| 2012/0150354 A1 * | 6/2012 | Rogers | G05B 19/4015 | 700/279 |
| 2012/0213604 A1 * | 8/2012 | Gu | G05B 19/402 | 409/131 |
| 2013/0253871 A1 * | 9/2013 | Gray | B23Q 17/22 | 702/95 |

FOREIGN PATENT DOCUMENTS

| | | | | |
|---|---|---|---|---|
| DE | 4301486 C1 * | 3/1994 | | B24B 47/25 |
| DE | 195 01 094 A1 | 7/1996 | | B25J 19/00 |
| DE | 29916325 U1 * | 1/2000 | | B23Q 16/00 |
| EP | 1 549 459 | 7/2005 | | B23Q 17/22 |
| JP | 08257878 A * | 10/1996 | | |
| JP | 2009/519137 A | 5/2009 | | B23Q 15/00 |
| JP | 2011/173234 A | 9/2011 | | B23Q 15/24 |
| SK | EP 2584419 A2 * | 4/2013 | | G05B 19/401 |
| WO | WO 9743703 A1 * | 11/1997 | | G05B 19/404 |
| WO | WO 2006/079617 A1 | 8/2006 | | B25J 9/16 |
| WO | WO 2009/057229 A1 | 5/2009 | | B23Q 17/22 |

OTHER PUBLICATIONS

First Official Action of the State Intellectual Property of the PRC; Application No. 20131016822.3, 12 pages.

* cited by examiner

SYSTEM AND METHOD FOR ERROR CORRECTION FOR CNC MACHINES

PRIORITY

This application claims priority from European patent application number EP12163426.5, filed Apr. 5, 2012, titled "Device for Error Correction For CNC Machines," and naming Giuseppe Morfino and Augusto Mignani as inventors, the disclosure of which is incorporated herein, in its entirety, by reference.

TECHNICAL FIELD

The present invention relates to a method and system for determining a positioning error of a computerized numerical control (CNC) machine, in particular, to a method and a system for determining a positioning error of a CNC machine tool head and/or CNC machine table.

BACKGROUND

European patent number EP1,549,459 teaches a method and device for determining a positioning error of a CNC machine tool head or machine table. According to the method, a support base is equipped with a plurality of distance sensors to determine the Cartesian coordinates of a gauge tool equipped with a ball. In order to determine the positioning error of the tool head, the plurality of distance sensors measure the respective distances to the ball. Then the tool head or table performs an angular motion whereas at the same time the machine performs a circular or helical counter motion such that the ball of the gauge tool remains in its position. Then the plurality of distance sensors measure the respective distances to the ball again. Due to a positioning error of the tool head these distances may differ. Then the machine is caused to perform a linear motion with respect to the Cartesian coordinate axes so that the plurality of distance sensors measure the original distances again, whereas at the same time the angular position of the head or table remains fixed. From this compensation movement, the positioning error of the head or table may be determined as the linear motions which were necessary to compensate the positioning error of the head or table.

The device of EP1,549,459 has a controls for the CNC machine that reads and processes the data from the plurality of sensors. When there is no common interface between the plurality of sensors and the CNC machine available, e.g. because both devices were fabricated by different manufacturers, the controls has to be configured to interface to sensors with different types of interfaces.

There is a need for a method and device for determining a positioning error of a CNC machine, in particular, of a CNC machine tool head and/or a CNC machine table, which works independently of the control of the CNC machine and, in particular, requires no common interface with the control of the CNC machine.

SUMMARY OF THE EMBODIMENTS

The present embodiment provides a method for determining a positioning error of a CNC machine. The CNC machine is equipped with a calibration element, which is positioned at a first position. The method includes reading first sensor data from at least one sensor while the calibration element is at the first position. The sensor data may correspond to a distance between a point on the surface of the calibration element and the at least one sensor. Alternatively, a contact element of the at least one sensor is deflected by the calibration element, and the sensor data correspond to a distance by which the contact element is deflected.

The method includes operating the CNC machine to perform a calibration movement that ideally leaves the calibration element at the first position. The method includes reading second sensor data from the at least one sensor while the calibration element is at a second position. The second position may denote the actual position of the calibration element after the calibration movement has been performed.

The method includes causing the at least one sensor to move so that the difference between the first and second sensor data decreases until the difference becomes less or equal to a pre-determined threshold value. The method includes determining a positioning error of the CNC machine based on the movement of the at least one sensor.

The computerized numerical control (CNC) machine may be any CNC machine known in the art, in particular, a machine tool and/or a robot. The CNC machine may be operated in the Rotations along Tool Center Point (RTCP) mode. The CNC machine may include a tool head, in particular, a rotary head, like a bi-rotary milling head. The CNC machine may include a machine table, in particular, a movable machine table, like a rotary table and/or a rotary tilting table. A tool head and/or a machine table may be equipped with the calibration element.

A tool head may denote an interface between the CNC machine and a tool, in particular, a tool for shaping, such like milling, drilling, or cutting. Other tools, like measuring or testing tools, are also possible. For performing the above-described method, it may be preferable to replace a removable tool with the calibration element. However, it may also be possible to use the tool itself as the calibration element, which is advantageous if the tool is not removable or difficult to remove.

A machine table may hold and/or move, in particular, rotate, a work piece. For performing the above-described method, it is preferable to replace the work piece with the calibration element. The calibration element may be placed on and/or fixed to the machine table.

The calibration element may include a solid or hollow ball, in particular, a ball made from a hard material like metal. The ball may have the shape of a sphere, wherein the shape may be of a high geometrical accuracy but need not be geometrically perfect. The ball may be connected to the tool head by a cylinder. Other shapes of the calibration element are possible. In particular, the calibration element may include an ellipsoid and/or a cylinder.

The at least one sensor may be one sensor, two sensors, three sensors, or more than three sensors, which may be mounted on a common support base.

One or more of the sensors may be a distance sensor which outputs sensor data corresponding to the distance between a point on the surface of the calibration element and the sensor. The distance sensor may, in particular, be a sensor that is not in physical contact with the calibration element. For example, one or more of the sensors may be an optical sensor, in particular, a laser sensor, an acoustic sensor, in particular, an ultrasonic sensor, a capacitive sensor, and/or an inductive sensor.

One or more of the sensors may be a contact point sensor and/or a dial indicator which includes a deflectable portion and a non-deflectable portion. The deflectable portion may include a contact element which is in contact with the calibration element, more specifically, with a point on the surface thereof. The one or more contact point sensors output sensor data which corresponds to a distance by which the deflectable portion, in particular, the contact element thereof, is deflected by the calibration element, in particular, by a point on the surface thereof. A contact point sensor may, in particular, include a geometrical sensor axis along which the contact element may be deflected. Then the contact element is deflected by the point on the surface of the calibration element which is on the geometrical sensor axis.

In one step of the method, the at least one sensor outputs first sensor data while the calibration element is at the first position. That is, the first sensor data may represent the first position of the calibration element, in particular, the center of a ball thereof. This first position may be known to the CNC control, but unknown to the at least one sensor. It may however not be necessary to compute the first position of the calibration element from the first sensor data. In particular, it may not be important which point on the surface of the calibration element is taken to represent the first position. This may have the advantage of a greater freedom in positioning of the at least one sensor. In particular, the sensors need not be orthogonally positioned nor positioned very precisely.

In another step of the method the CNC machine is operated to perform a single movement or a sequence of movements which, according to the CNC control, would not move the calibration element, in particular, the center of a ball thereof, from its first position. The CNC machine may be operated to cause a tool head and/or a machine table thereof to perform a single movement or a sequence of movements which, according to the CNC control, would not move the calibration element, in particular, the center of a ball thereof, from its first position. The CNC machine may be operated in the RTCP mode while performing said movement or sequence of movements. Such movements may include rotations about various axes. In particular, when the calibration element includes a ball, the first position may be represented by the center of the ball by the CNC control. Then, a movement that does not move the calibration element from its first position means that the center of the ball does not move. The ball may, however, be rotated about any axis through its center. If the ball is connected to the CNC machine, in particular to a tool head or a machine table thereof, by an element, like a cylinder, said element itself may be moved during the movement.

Although preferably, according to the CNC controls, the calibration element (in particular, the center of a ball thereof) has not moved during the movement, it may have moved due to a positioning error caused by a geometrical mechanical error of the CNC machine (in particular, of a tool head or machine table thereof). The actual position of the calibration element, in particular, the center of a ball thereof, at this point maybe unknown to the CNC control and the at least one sensor. The CNC control assumes that the first and second positions of the calibration element, as such, are the same.

In another step of the method the at least one sensor outputs second sensor data while the calibration element, in particular, the center of a ball thereof, is at a position after the movement. The point on the surface of the calibration element may be a different point or the same point as the point corresponding to the first sensor data. The second sensor data represents the second position of the calibration element, in particular, the center of a ball thereof.

In another step of the method the at least one sensor is caused to move so that the difference, in particular, the absolute difference, between the first and second sensor data decreases, thereby partially or fully compensating the positioning error by sensor movement. This movement may be monitored in a takt time (i.e., different in measurement time) or in real time, and adjusted upon feedback. Alternatively, this movement may be partially or completely calculated in advance from the first and second sensor data indicating the sensor movement may be stored for further processing.

The at least one sensor may include a movement element for moving the at least one sensor, or be mounted to the movement element. The at least one sensor may also be mounted to a support base which includes a movement element for moving the support base, or be mounted to the movement element. In particular, at least two sensors, preferably at least three sensors, may be mounted to a common support base which is equipped with a movement element for moving the support base and, therefore, moving the sensors concurrently.

When the difference, in particular, the absolute difference, between the first and second sensor data becomes less or equal to a threshold value, the current sensor data equals the first sensor data within an acceptable range. The threshold value may be the graduation and/or accuracy of the at least one sensor and/or the CNC machine control. The threshold value may be a percentage of the first sensor data, in particular 1% or 0.1% thereof, or correspond a fixed value, in particular, 10 μm, preferably 5 μm, or more preferably 3 μm. The smaller the value, the more precise is the result.

In another step of the method, the positioning error of the tool head, in particular, the center of a ball thereof, with respect to the movement of the tool head, in particular, the center of a ball thereof, is determined based on the movement of the at least one sensor. The movement of the at least one sensor may be a superposition of all movements which were performed so that the current sensor data equals the first sensor data within the above-described range. More specifically, the error may be determined from data indicating the movement of the at least one sensor. This has the advantage that no common interface between the at least one sensor and the control of the CNC machine is necessary for determining the position error.

The method may further include the steps of determining, from the first and second sensor data, in particular, from the difference thereof, a first compensation direction, in such a way that a movement of the at least one sensor in the first compensation direction will decrease the difference between the first and second sensor values, and causing the at least one sensor to move in the first compensation direction.

By comparing the first and second sensor data, in particular from the difference of the first and second sensor data, a direction in which the first and second positions of the calibration element differ may be determined. In other words, from the difference of the first and second sensor data, a direction in which the calibration element has moved during the movement may be determined. This direction need not be the exact direction of the actual displacement vector of the calibration element with respect to the movement. This has the advantage that the measurement does not have to be precise. The first compensation direction may then be the direction opposite to said direction, so that a movement of the at least one sensor in the first compensation direction will fully or partially compensate the displacement vector and, therefore, decrease the difference, in particular, the absolute difference, between the first and second sensor data.

The step of determining a first compensation direction may include determining a velocity vector so that a corresponding movement will move the at least one sensor in the first compensation direction.

The step of determining a first compensation direction may further include determining a first compensation value which may indicate a distance in the first compensation direction, wherein the distance may correspond to a necessary distance to fully or partially compensate the displacement vector by moving the at least one sensor in the first compensation direction.

The at least one sensor may be caused to move in the first compensation direction to fully or partially compensate the difference between the first and second sensor data, wherein the at least one sensor may be caused to move into said direction for a pre-set time. This pre-set time may be a takt time. That is, the movement in the first compensation direction will be initiated and maintained until a different compensation direction is determined based on subsequently read sensor data.

Alternatively, the at least one sensor may be caused to move into said direction for a pre-set or calculated distance. A pre-set distance may be a constant increment which may be the same for all sensor movements and, in particular, may be independent from the first compensation direction. A calculated distance may be the first compensation value or be calculated based on the first compensation value.

The method, in particular, the causing step, may further include performing a closed-loop including the steps of reading the current sensor data from at least one sensor, determining, from the first and current sensor data, in particular, from a difference thereof, a current compensation direction, in such a way that a movement of the at least one sensor in the current compensation direction will decrease the difference, between the first and current sensor data, and causing the at least one sensor to move in the current compensation direction.

The step of reading current sensor data may be implemented as a first step in the loop, or as a later step in the loop. In particular, in a first execution of the loop, the current sensor data may be the second sensor data.

The sensor data of the at least one sensor may be continuously monitored so that current sensor data is continuously read. Current sensor data may also be read in certain time intervals. This time interval may a takt time, or a fraction thereof, or a multiple thereof. From the difference between the first and current sensor data a current compensation direction may be determined. The current compensation direction may be an opposite direction of a direction defined by the difference between the first and current sensor data. That is, the current compensation direction is a direction that, when moving the at least one sensor in said direction, will result in a decrease in the difference, in particular, the absolute difference, between the current and first sensor data.

The step of determining a current compensation direction may further include determining a current compensation value which may indicate a distance necessary to fully or partially compensate the displacement vector by moving the at least one sensor in the current compensation direction.

The at least one sensor may be caused to move into the current compensation direction for a pre-set time. This pre-set time may be a takt time. That is, the movement in the current compensation direction will be initiated and maintained until a different compensation direction is determined in a subsequent loop.

Alternatively, the at least one sensor may be moved by a pre-set or calculated distance. A pre-set distance may be a constant increment which may be the same for all sensor movements and, in particular, may be independent from the current compensation direction. A calculated distance may be the current compensation value or be calculated based on the current compensation value.

During and/or after the movement the current sensor data may be read again, and the loop may restart with the new current sensor data. At the end of the loop, it may be determined if the difference, in particular, the absolute difference, between the current and first sensor data falls below a threshold value. If so, the loop may end.

The method, in particular, the step of determining the first and/or current compensation direction may include transforming the sensor data into components with respect to a pre-determined coordinate system, in particular, an orthogonal coordinate system.

The at least one sensor may include a geometrical sensor axis and the sensor data may correspond to a distance on the geometrical sensor axis. In particular, the sensor axis may be fixed. A displacement vector corresponding to the distance on the geometrical sensor axis may then be expressed in terms of a pre-determined coordinate system. This coordinate system may be an orthogonal, preferably an orthonormal coordinate system, such as a Cartesian coordinate system. The displacement vector may further be decomposed into components with respect to the coordinate system.

In particular, when using a Cartesian coordinate system with coordinates x, y and z, the sensor data may be expressed by three components $S_x$, $S_y$, $S_z$, so that the distance S on the geometrical sensor axis satisfies $S^2=S_x^2+S_y^2+S_z^2$. Analogously, when at least two sensors are used, the respective distances $S_1$, $S_2$, etc. on the respective geometrical sensor axes may be expressed in respective coordinates $S_{1,x}$, $S_{1,y}$, $S_{1,z}$, $S_{2,x}$, $S_{2,y}$, $S_{2,z}$, etc.

Reading the first, second and/or current sensor data may include reading the first, second and/or current sensor data from at least two sensors and wherein determining the first and/or current compensation direction may include determining components of a velocity vector with respect to the pre-determined coordinate system, in particular, an orthogonal coordinate system, so that a corresponding movement of the at least one sensor will decrease the absolute difference between the first and current sensor data.

In particular, determining the velocity vector may include weighting the components of the velocity vector over the relative difference between the components of the first and current sensor data.

Alternatively, determining the first and/or current compensation direction may include averaging the respective components of the at least two sensors, or adopting the respective component having the greatest absolute value, or adopting the respective component having the lowest absolute value.

In particular, reading the first, second and/or current sensor data may include reading the first, second and/or current sensor data from at least three sensors, and wherein determining the first and/or current compensation direction may include determining components of a velocity vector with respect to the pre-determined coordinate system, in particular, an orthogonal coordinate system, so that a corresponding movement of the at least one sensor will decrease the absolute difference between the first and current sensor data, wherein determining the velocity vector may include weighting the components of the velocity vector over the relative difference between the components of the first and current sensor data of the sensors.

The threshold value may be expressed in terms of the coordinate system, in particular, the threshold value may be expressed in terms of components with respect to the coordinate system, or be expressed in terms of the sensor data. In other words, the threshold value may be expressed directly in terms of the sensor data, or in terms of the pre-determined coordinate system.

In particular, when using a Cartesian coordinate system, the threshold value T may be expressed in components $T_x$, $T_y$, $T_z$ with respect to the Cartesian coordinates x, y and z. Then the threshold condition may be expressed as $S_x \leq T_x$, $S_y \leq T_y$ and $S_z \leq T_z$. The threshold value T may be the same or different for each sensor. That is, for example for two sensors, we may have the conditions $S1 \leq T1$ and $S2 \leq T2$, wherein T1 and T2 may be the same or different.

The at least one sensor may be caused to move by translation along at least one coordinate axis of the coordinate system. In particular, when using a Cartesian coordinate system, the at least one sensor may be caused to translate along the x, y and z-axis. The at least one sensor may include a movement element, or be fixed to a movement element, wherein the movement element includes at least one motors, e.g. an electro-motor, wherein the at least one motor is configured to translate the at least one sensor along the x-axis, y-axis or z-axis. The movement element may include at least three motors, e.g. electro-motors, wherein at least one of the at least three motors is configured to translate the at least one sensor along the x-axis, y-axis and z-axis, respectively.

The at least one sensor may be caused to move along each of the coordinate axes of the coordinate system separately. In other words, the at least three motors may be controlled separately.

At least two sensors may be caused to move together, in particular, wherein the at least two sensors may be fixed to a common support base. The at least two sensors may be mounted on the support base, wherein the at least two sensors may be fixed to the support base directly or via one or more elements, e.g. pedestals or sockets. The pedestals and/or sockets may include one or more cylinders. The support base may include a movement element for moving the support base and thereby also the at least two sensors.

The at least two sensors may be arranged so that some sensor axes are non-parallel. In particular, the at least two sensors, in particular, at least three sensors, may be arranged so that at least two sensors thereof, in particular, at least three sensors, have mutually non-parallel sensor axes. The at least two sensors may further be arranged so that all sensor axes are mutually non-parallel.

Three sensors may be fixed at the edges of an imaginary triangle formed parallel to a surface of the support base, wherein each of the sensors is directed to the center of the triangle and inclined against the surface of the support base. Here imaginary means that there need not be an actual triangle indicated on or over the surface. In particular, the three sensors may be fixed at the edges of an imaginary equilateral triangle, wherein the calibration element in its first position may be located over the center of the triangle. The three sensors may be inclined against the surface by an inclination angle, wherein the angle may be in a range of 40° to 80°, preferably 50° to 70° or 55° to 65°, or essentially 60°, where essentially means that the inclination angle may differ from 60° by a value acceptable in the field. The inclination angles of the three sensors may be the same or different. In particular, at least one of the three sensors, preferably at least two of the three sensors or all three sensors, may point at the center of a ball of the calibration element. The three sensors may be pointed so that at least two of the three sensor axes form an angle of at least 90°. The three sensors may be pointed so that the sensor axes of the three sensor axes form a mutual angle of at least 90°. When a Cartesian coordinate system is used, two coordinate axes may be parallel to the surface of the support base and one coordinate axis may be perpendicular to the surface of the support base. In particular, the coordinate axis perpendicular to the surface, e.g. the z-axis, may represent a height, whereas the coordinate axes parallel to the surface, e.g. x-axis and y-axis, may represent lateral dimensions.

The method may further include outputting data indicating the positioning error of the tool head, in particular, wherein outputting includes any one of displaying, printing, transmitting, and/or saving the data. In particular, the determined positioning error may be transformed into data readable by a computer system, in particular, the operation system of the CNC control.

The embodiment further provides a method for improving the accuracy of a CNC machine. The method includes determining a positioning error of the CNC machine, in particular of a tool head and/or a machine table thereof, by performing any one of the methods as described hereinbefore, and compensating the positioning error of the CNC machine, in particular of a tool head and/or machine table thereof. Compensating the positioning error of the CNC machine, in particular of a tool head and/or machine table thereof, may include adjusting the programming of the CNC machine based on the positioning error, and/or may further include inputting data indicating the positioning error of the tool head into the CNC machine control.

The embodiment further provides a system for determining a positioning error of a CNC machine. The CNC machine is equipped with a calibration element. The system includes at least one sensor configured to output sensor data. The sensor data may correspond to a distance between a point on the surface of the calibration element and the at least one sensor. Alternatively, a contact element of the at least one sensor is deflected by the calibration element, and the sensor data corresponds to a distance by which the contact element is deflected.

The system may include a movement element for moving the at least one sensor, and a control unit for processing the sensor data received from the at least one sensor. The control unit may control the movement element. The control unit may be configured to receive the first and second sensor data and output drive data to the movement element which causes the movement element to move the at least one sensor so that the difference between the first and second sensor data decreases until the difference becomes less or equal than a threshold value. The control unit may determine a positioning error of the tool head based on the movement of the at least one sensor. The CNC machine may be any CNC machine as known and used in the field, in particular, a machine tool and/or a robot. The CNC machine may be operated in the Rotations along Tool Center Point (RTCP) mode. The CNC machine may include a tool head, in particular, a rotary head like a bi-rotary milling head. The CNC machine may include a machine table, in particular, a movable machine table, like a rotary table and/or a rotary tilting table. A tool head and/or a machine table may be equipped with a calibration element.

A tool head may denote an interface between the CNC machine and a tool, in particular, a tool for shaping, such like milling, drilling, or cutting. Other tools, like measuring and/or testing tools, are also possible. A machine table may hold and/or translate and/or rotate a work piece.

The CNC machine, in particular, a tool head and/or machine table thereof, is equipped with a calibration element, wherein the calibration element may be an element used only for the purpose of calibrating the CNC machine and/or determining a positioning error of the CNC machine, in particular, of a tool head and/or a machine table thereof. The calibration element may also be a tool itself.

The at least one sensor may be one sensor, two sensors, three sensors, or more than three sensors, which may be mounted on a common support base.

One or more of the sensors may be a distance sensor which outputs sensor data corresponding to the distance between a point on the surface of the calibration element and the sensor, wherein the distance sensor may, in particular, be a sensor that is not in physical contact with the calibration element. For example, one or more of the sensors may be an optical sensor, an acoustic sensor, a capacitive sensor, and/or an inductive sensor.

One or more of the sensors may be a contact point sensor and/or a dial indicator which includes a deflectable portion and a non-deflectable portion. The deflectable portion may include a contact element which is in contact with the calibration element, more specifically a point on the surface thereof. The one or more contact point sensors output sensor data which corresponds to a distance by which the deflectable portion, in particular, the contact element thereof, is deflected by the calibration element, in particular, by a point on the surface thereof. A contact point sensor may, in particular, include a geometrical sensor axis along which the contact element may be deflected. Then the contact element is deflected by the point on the surface of the calibration element which is on the geometrical sensor axis.

The movement element may be fixed to the at least one sensor, or fixed to a support base, wherein the at least one sensor may be mounted on said support base.

The control unit may include processing means for processing the sensor data and/or other data. The control unit may further include storage means for caching data and/or storing data permanently. The control unit may further include an input interface for receiving sensor data from the at least one sensor, wherein the at least one sensor may communicate with the control unit via a wired connection and/or a wireless connection, and/or receiving other data and/or instructions. The control unit may further include an output interface for outputting data to the movement element, wherein the movement element may communicate with the control unit via wired connection and/or wireless connection, and/or the output unit and/or other units.

The control unit may receive first and second sensor data while the calibration element is in a first and second position of the calibration element, respectively, wherein the first position may refer to an initial position, that is, a position before a movement of the calibration element. The second position of the calibration element may refer to a subsequent position after a movement of the calibration element, in particular, a movement which ideally, that is according to the CNC control, leaves the calibration element in a fixed position. The first and second sensor data may be received via the input interface.

The control unit may compute, from the first and second sensor data, in particular, from a difference thereof, a direction in which the at least one sensor may be moved so that the difference, in particular, the absolute difference, between the first and second sensor data decreases, and output according movement data to the movement element. This outputting of movement data may be performed via the output interface.

The control unit may be configured to perform any one of the methods as described hereinbefore.

In particular, the control unit may be configured to perform a step of determining, from the first and second sensor data, in particular, from the difference thereof, a first compensation direction, wherein movement of the at least one sensor in the first compensation direction will decrease the difference, in particular, the absolute difference, between the first and second sensor values, and causing the at least one sensor to move in the first compensation direction.

The control unit may further be configured to perform a closed-loop including the steps of determining, from the first and current sensor data, in particular, from the difference thereof, a current compensation direction, wherein movement of the at least one sensor in the current compensation direction will decrease the difference, in particular, the absolute difference, between the first and current sensor values, causing the at least one sensor to move in the current compensation direction, and reading the current sensor data from at least one sensor.

The control unit may be configured to transform the sensor data into components with respect to a pre-determined coordinate system, in particular, an orthogonal coordinate system.

The control unit may be configured to read the first, second and/or current sensor data from at least two sensors, in particular, from at least three sensors, and wherein determining the first and/or current compensation direction may include determining components of a velocity vector with respect to the pre-determined coordinate system, in particular, an orthogonal coordinate system, so that a corresponding movement of the at least one sensor will decrease the absolute difference between the first and current sensor data.

The control unit may be further configured to express the threshold value in terms of the coordinate system. In particular, the threshold value may be expressed in terms of components with respect to the coordinate system, or to express the threshold value in terms of the sensor data.

Moreover, the control unit may be configured to output movement data causing the movement element to move the at least one sensor by translation along at least one coordinate axis of the coordinate system.

The system may further include an output unit configured to output error data corresponding to the positioning error of the tool head, wherein outputting includes any one of displaying, printing, transmitting and/or saving the error data.

The output unit may be a display device, a printing device, a transmission device and/or a storage device, and/or may be connected to a display device, a printing device, a transmission device and/or a storage device. The output device may also be connected to the CNC machine.

At least one sensor may be a contact point sensor, a dial indicator, a light sensor, a laser sensor, an ultrasonic sensor, a capacitive sensor, and/or an inductive sensor.

The movement element may include at least one motor, in particular, at least one electro-motor. The movement element, in particular, a motor of the movement element, may move the at least one sensor by translation along at least one coordinate axis of a coordinate system, in particular, an orthogonal coordinate system. In particular, the at least one sensor may be mounted to a support base and the at least one motor may move the support base and thereby the at least one sensor by translation along at least one coordinate axis of a coordinate system, in particular, an orthogonal coordinate system.

The movement element may include at least two motors. The at least two motors may be controlled separately, in particular, where the movement element may move the at least one sensor and/or the support base by translation along at least two coordinate axes separately. The motors may be configured to move the at least one sensor and/or the support base directly or via gears. The motors may be located in a distance to the at least one sensor and/or support base and include gear shafts that are connected to the at least one sensor and/or support base.

The movement element may be configured to move at least two sensors together, in particular, wherein the at least two sensors are fixed to a common support base. The movement element may also be configured to move the support base and thereby the at least two sensors.

The at least two sensors may be arranged so that some sensor axes are non-parallel. In particular, the least two sensors, in particular, at least three sensors, may be arranged so that at least two sensors thereof, in particular, at least three sensors, have mutually non-parallel sensor axes. The at least two sensors may further be arranged so that all sensor axes are mutually non-parallel.

Three sensors may be fixed at the edges of an imaginary triangle formed parallel to a surface of the support base, wherein each of the sensors is directed to the center of the triangle and inclined against the surface of the support base. Here imaginary means that there need not be an actual triangle indicated on or over the surface. In particular, the three sensors may be fixed at the edges of an imaginary equilateral triangle, wherein the calibration element in its first position may be located over the center of the triangle. The three sensors may be inclined against the surface by an inclination angle, wherein the angle may be in a range of 40° to 80°, preferably 50° to 70° or 55° to 65°, or essentially 60°, where essentially means that the inclination angle may differ from 60° by a value acceptable in the field. The inclination angles of the three sensors may be the same or different. In particular, at least one of the three sensors, preferably at least two of the three sensors or all three sensors, may point at the center of a ball of the calibration element. The three sensors may be pointed so that at least two of the three sensor axes form an angle of at least 90°. The three sensors may be pointed so that the sensor axes of the three sensor axes form a mutual angle of at least 90°. When a Cartesian coordinate system is used, two coordinate axes may be parallel to the surface of the support base and one coordinate axis may be perpendicular to the surface of the support base. In particular, the coordinate axis perpendicular to the surface, e.g. the z-axis, may represent a height, whereas the coordinate axes parallel to the surface, e.g. x-axis and y-axis, may represent lateral dimensions.

The calibration element may include a ball. The ball may be connected to the tool head via an element, in particular, a cylinder. The ball may be formed of a hard material, e.g. a metal.

BRIEF DESCRIPTION OF THE DRAWINGS

The present embodiments will be described by some preferred embodiments, provided as non-limiting examples, with reference to the enclosed drawings, in which.

DETAILED DESCRIPTION OF EMBODIMENT

Figure 1:
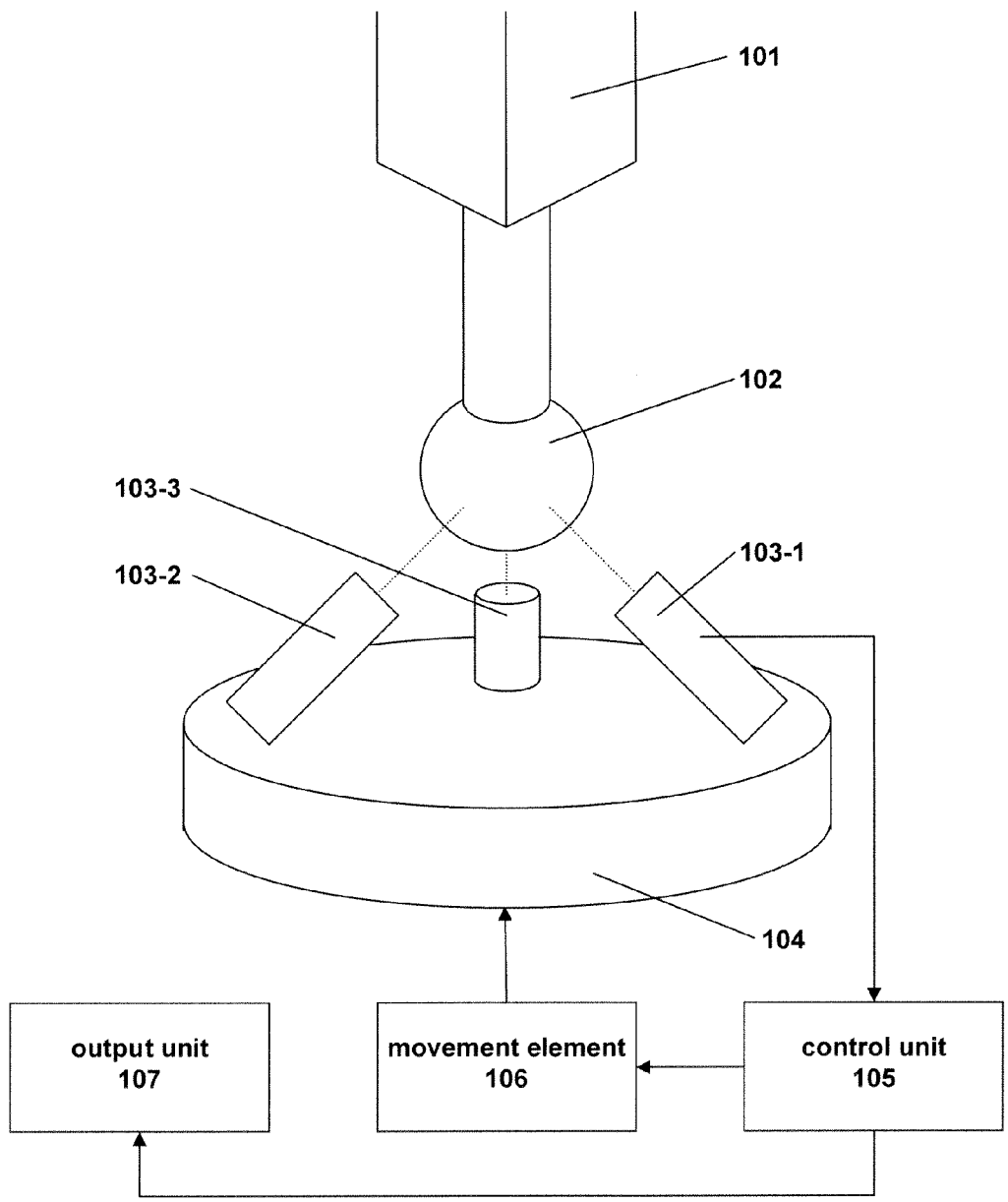
FIG. 1 shows a schematic view of a system for determining a positioning error of a tool head of a CNC machine.

With reference to FIG. 1, a system for determining a positioning error of a CNC machine, more specifically of a tool head 101 thereof, equipped with a calibration element 102 includes at least one sensor 103 (shown as 103-1, 103-2, and 103-3), a control unit 105, and a movement element 106. The system may further include a support base 104 and/or an output unit 107. Alternatively, the CNC machine may include a machine table equipped with a calibration element 102.

The machine tool head 101 represents an interface between the CNC machine and a tool, wherein the tool may be replaceable. The tool may be a tool for shaping, e.g. cutting, milling, drilling, or for measuring and/or testing.

The calibration element 102 may be a an element explicitly used for determining a positioning error and/or otherwise calibrating the CNC tool head, or the calibration element 102 may be the tool itself. The former is preferable because the shape of a tool may make it difficult to determine a reliable positioning error of the tool head 101. The latter may be advantageous if the tool is not removable or difficult to remove from the tool head 101. In the present example the calibration element 102 has a shape of a ball which is connected to the tool head via a cylindrical element. This ball 102 is preferably formed of a hard material, like metal. The ball 102 may be solid or hollow.

The number of sensors 103 may be one, two, three, or more than three. In the present example, three sensors 103-1, 103-2 and 103-3 are used. The sensors 103 may be mounted on a support base 104, wherein they may be fixed at the corners of an imaginary triangle, in particular, an equilateral triangle on the surface of the support base 104, or parallel to the surface. The sensors 103 may also be located on sockets, pedestals or the like, which may be fixed to the surface of the support base 104. The sensors 103 may have a cylindrical portion along a geometric sensor axis. In particular, they may include a stationary, in particular, non deflectable, portion whose position along the geometrical sensor axis is fixed. The sensors may further include a portion that is movable, in particular, deflectable, along the sensor axis, such as a sensor head.

The sensors 103 may, in particular, be contact point sensors, where the sensor head includes a contact element which is in contact with a point on the surface of the ball 102. More specifically, the contact element is in contact with the point on the surface of the ball 102 and on the sensor axis which is closest to the stationary portion of the sensor 103. The sensors 103 may be inclined against the surface of the support base 104 by an inclination angle. The angle may be the same for each sensor 103, or different. The angle may be in the range of 40° to 80°, preferably 50° to 70°, more preferably 55° to 65°. Under a higher inclination angle the ball 102 may be better accessible by the sensors 103. In particular, this permits easy positioning of the ball 102 and a collision free movement of the tool head 101. The inclination angles of the sensors 103 may be chosen so that the mutual angles between the axes of the sensors 103 are at least 90°. The sensors 103 may be arranged to mutually point at the center of a ball 102. The three sensor axes of the sensors 103 may form a mutual angle of at least 90°. The support base 104 may include a cylindrical portion. Moreover, the support base 104 may include socket, pedestals or the like, for mounting the sensors 103. The support base 104 may also include adjustment means for adjusting the height and/or lateral position of the sensors 103, and/or fixing means for fixing the height and/or lateral position of the sensors.

The control unit 105 may include processing means for processing data received from the sensors 103 and/or data received otherwise. The control unit 105 may further include storage means for caching or storing data. The storage means may include volatile memory and/or persistent memory. Information representing the geometrical layout of the sensors 103, for example, the spatial orientation of their sensor axes, may be saved in the memory. The control unit 105 may include an input interface for receiving data, in particular, sensor data from the sensors 103. The input interface may include a plurality of entries. In particular, the sensors 103 may be connected to the input interface separately. The sensors 103 may be connected to the input interface by wired connection and/or wireless connection. The input interface may also serve for inputting instructions into the control unit 105 and/or updating the control unit 105. The control unit 105 may further include an output interface for outputting data. The output interface may be connected to the movement element 106. This connection may be a wired connection and/or a wireless connection. The output interface may be further connected to an output unit 107. This connection may also be a wired connection and/or a wireless connection.

The movement element 106 may include one, two, three, or more than three motors, preferably electro-motors. In particular, the movement element 106 may include three motors which are configured to translate the support base 104 along each of the three coordinate axes x, y, and z of a Cartesian coordinate system. The three different translations may be controlled by addressing the three motors separately. The three motors may be connected to the control unit 105, in particular, to an output interface thereof, separately or collectively. The movement element 106 may be fixed to the sensors 103 directly and/or to the support base 104.

The output unit 107 may include a display, a printer, a transmitter, and/or a storage device, and/or be connected to a display, a printer, a transmitter, and/or a storage device. The output unit 107 may also be connectable to the control of the CNC machine. The output device 107 may be connected to the control unit 105, in particular, the output interface thereof.

In operation of the system, at least one of the sensors 103, preferable each of the sensors 103, outputs sensor data while the ball 102 is in a given position. That is, the sensor data represents the current position of the ball 102, without necessarily determining the actual position of the ball 102. The sensor data is then transferred to the control unit 105, in particular, to an input interface thereof.

The control unit 105 receives the sensor data from the sensors 103, in particular, via an input interface. The control unit 105, in particular, processing means thereof, determine if the sensor data satisfies certain conditions. In particular, the control unit 105 may examine if the difference, in particular, the absolute difference, between sensor data taken at two different times falls below a threshold value. The control unit 105, in particular, processing means thereof, may determine movement data from the sensor data. The movement data and/or the sensor data may be cached and/or saved within the control unit 105, in particular, within storage means thereof. The movement data may include three separate commands for the three motors of the movement element 106. The control unit 105 may transmit the movement data to the movement element 106, in particular, via an output interface.

The movement element 106 receives the movement data from the control unit 105, in particular, via an output interface thereof. The movement data may include commands for at least one of the motors. In particular, the movement data may include commands for three motors which are configured to translate the sensors 103 and/or the support base 104 along the Cartesian axes. The commands for a motor may include instructions to translate the sensors 103 and/or the support base 104 along the respective axis in a forward direction, in a backward direction, to reverse the translation, and/or to stop the translation. The commands for a motor may further include instructions to translate the sensor 103 and/or the support base 104 with a certain velocity and/or for a certain distance.

After the movement element 106 has moved the sensors 103 and/or the support base 104 according to the movement data output by the control unit 105, the sensors 103 output new sensor data. The control unit 105, in particular, the input interface thereof, receives the new sensor data from the sensors 103 and compares the difference, in particular, the absolute difference, between the new sensor data and previous sensor data, in particular, sensor data representing an initial position of the ball 102, with a threshold value. If the threshold value is not met, new movement data is determined and output to the movement element 106. If the threshold value is met, the control unit 105, in particular, the processing means thereof, determines a positioning error of the tool head from the cached and/or stored movement data. In a Cartesian coordinate system, the positioning error (Dx, Dy, Dz) may be the sum of the movement data corresponding to the movements that were necessary to move the sensors 103 and/or the support base 104 in order to meet the threshold value.

The control unit 105 may output the positioning error to the output unit 107. The output unit 107 may display, print, transmit, and/or save the positioning error. The output unit 107 may also input the positioning error into the control of the CNC machine.

The sensors 103, the support base 104, the control unit 105, the movement element 106, and/or the output unit 107 may be separate units and/or elements, or may be part of the same unit and/or element of the system.

Figure 2A:
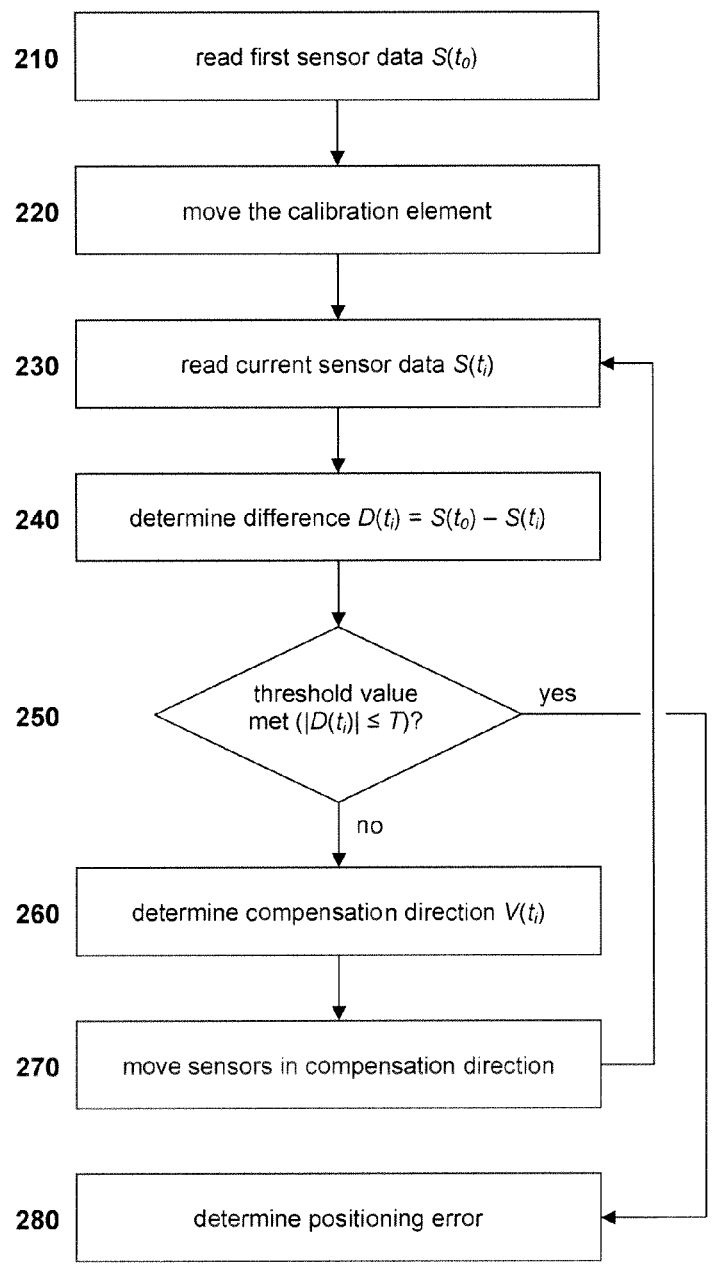
FIG. 2A shows a flow diagram of a method for determining a positioning error of a tool head of a CNC machine.

With reference to FIG. 2A, a method for determining a positioning error of a tool head of a CNC machine includes the steps of: reading first sensor data 210, moving the tool head 220, reading current sensor data 230, determining the difference between the first and current sensor data 240, checking if a threshold value is met 250, and in response to the checking 250, determining a compensation direction 260 and moving the sensor in the compensation direction 270, or determining a positioning error 280.

In step 210, first sensor data $S(t_0)$, that is, sensor data at a time $t_0$, is read. The first sensor data represents the first position of the calibration element 102 which is connected to the tool head 101. The first position corresponds to an initial position of the calibration element 102, that is, before the tool head 101 is moved in order to determine a positioning error thereof. The first position is known to the control of the CNC machine but unknown to the control unit 105. The CNC control may operate in Cartesian coordinates and set the first position to (0, 0, 0), wherein the first position may correspond to a pre-determined reference point on or in the calibration element 102, in particular, the center of a ball.

It is, however, not necessary for the control unit 105 to determine the first position. In the case of three sensors 103-1 to 103-3, the first sensor data $S(t_0)$ includes first sensor data $S_1(t_0)$, $S_2(t_0)$, and $S_3(t_0)$ of the sensors 103-1, 103-2, and 103-2, respectively. Each of the sensor data $S_1(t_0)$, $S_2(t_0)$, and $S_3(t_0)$ may have components with respect to a pre-determined coordinate system. If Cartesian coordinates are used, the first sensor data $S_1(t_0)$ of the sensor 103-1 may have components $S_{1,x}(t_0)$, $S_{1,y}(t_0)$, and $S_{1,z}(t_0)$ with respect to the Cartesian coordinate axes x, y, and z. Similarly, $S_2(t_0)$ and $S_3(t_0)$ may have components $S_{2,x}(t_0)$, $S_{2,y}(t_0)$, $S_{2,z}(t_0)$, $S_{3,x}(t_0)$, $S_{3,y}(t_0)$, and $S_{3,z}(t_0)$. The Cartesian components of the first sensor data may be determined from the known direction of the sensors, that is, the direction of the geometrical sensor axis, by trigonometric computations, as known in the art. However, in embodiments it may be unnecessary to determine the Cartesian components of the first sensor data.

In step 220, the CNC is operated to move the tool head 101 so that the calibration element 102 remains in a theoretically fixed position. That is, according to the CNC control this calibration movement does not change the position of the reference point of the calibration element 102. The calibration element 102 itself may however move. In particular, if the calibration element 102 includes a ball whose center is the reference point, the calibration movement leaves the center of the ball at the fixed position, while the ball may still rotate about any axis through its center. In other words, the CNC assumes that after the calibration movement the reference point is still at the first position, e.g. (0, 0, 0). Due to a positioning error of the CNC machine, in particular, of the tool head, the calibration element may however be at a second position which differs from the first position. If Cartesian coordinates x, y and z are used, said second position may be expressed as (Dx, Dy, Dz). This second position is known neither to the control of the CNC machine, which still assumes the position (0, 0, 0) instead of (Dx, Dy, Dz), nor by the control unit 105. It is an object of the present method to determine Dx, Dy, and Dz.

In step 230, current sensor data $S(t_i)$, that is, sensor data at a time $t_i > t_0$, is read. If the time $t_i$ corresponds to a time $t_1 > t_0$ before the sensors have been moved, the current sensor data $S(t_1)$ is the second sensor data representing the second position of the calibration element 102, that is, the position of the calibration element 102 after the calibration movement. The second position of the calibration element 102 corresponds to the positioning error (Dx, Dy, Dz) of the tool head and is unknown. In the case of three sensors 103-1 to 103-3, the current sensor data $S(t_i)$ includes current sensor data $S_1(t_i)$, $S_2(t_i)$, and $S_3(t_i)$ of the sensors 103-1, 103-2, and 103-2, respectively. Each of the sensor data $S_1(t_i)$, $S_2(t_i)$, and $S_3(t_i)$ may have components with respect to a pre-determined coordinate system. If Cartesian coordinates are used, the first sensor data $S_1(t_i)$ of the sensor 103-1 may have components $S_{1,x}(t_i)$, $S_{1,y}(t_i)$, and $S_{1,z}(t_i)$ with respect to the Cartesian coordinate axes x, y, and z. Similarly, $S_2(t_i)$ and $S_3(t_i)$ may have components $S_{2,x}(t_i)$, $S_{2,y}(t_i)$, $S_{2,z}(t_i)$, $S_{3,x}(t_i)$, $S_{3,y}(t_i)$, and $S_{3,z}(t_i)$. The Cartesian components of the current sensor data may be determined from the known direction of the sensors, that is, the direction of the geometrical sensor axis, by trigonometric computations, as known in the art. However, in embodiments it may be unnecessary to determine the Cartesian components of the current sensor data.

In step 240, the current difference $D(t_i) = S(t_0) - S(t_i)$ between the first and current sensor data is determined. In the case of three sensors 103-1 to 103-3, the current difference $D(t_i)$ may include the three differences $D_1(t_i) = S_1(t_0) - S_1(t_i)$, $D_2(t_i) = S_2(t_0) - S_2(t_i)$, and $D_3(t_i) = S_3(t_0) - S_3(t_i)$. In particular, the difference $D(t_i)$ may have Cartesian components $D_{1,x}(t_i)$, $D_{1,y}(t_i)$, $D_{1,z}(t_i)$, $D_{2,x}(t_i)$, $D_{2,y}(t_i)$, $D_{2,z}(t_i)$, $D_{3,x}(t_i)$, $D_{3,y}(t_i)$, and $D_{3,z}(t_i)$, wherein $D_{1,x}(t_i) = S_{1,x}(t_0) - S_{1,x}(t_i)$ and so forth. The Cartesian components of $D(t_i)$ may be determined directly from the Cartesian components of $S(t_i)$, or alternatively, by transforming the differences $D_1(t_i)$, $D_2(t_i)$, and $D_3(t_i)$ into displacement vectors along the geometrical axes of the sensors 103-1, 103-2, and 103-3, respectively, and then determining the Cartesian components of the respective displacement vectors from the known direction of the sensors, that is, the direction of the geometrical sensor axis, by trigonometric computations, as known in the art. However, in embodiments it may be unnecessary to determine the Cartesian components of the current difference. The signs of $D_1(t_i)$, $D_2(t_i)$, and $D_3(t_i)$ determine if, at the time $t_i$, the respective sensor is further deflected or less deflected than at the time $t_0$.

In step 250, the current sensor data is read and the difference $D(t_i)$, in particular, the absolute difference $|D(t_i)|$, between the current sensor data and the first sensor data is compared to a threshold value T. If the threshold is met, that is, if the difference $D(t_i)$, in particular, the absolute difference $|D(t_i)|$, is less or equal to the threshold value T, the positioning error is determined in step 280. If the threshold T is not met, that is, if the difference $D(t_i)$, in particular, the absolute difference $|D(t_i)|$, is greater than the threshold value T, the method proceeds to step 260. In particular, the threshold value T may have Cartesian components $T_x$, $T_y$, and $T_z$. The threshold condition may then include conditions like $|D_{1,x}(t_i)| \leq T_x$, and similarly for the other components. It also possible to require different threshold values $T_1$, $T_2$, and $T_3$ for the three sensors 103-1, 103-2, and 103-3. In this case the threshold condition may include conditions like $|D_{1,x}(t_i)| \leq T_{1,x}$, and similarly for the other components. Alternatively, the threshold condition may be checked for the sum of certain components of the difference $D(t_i)$. For example, the threshold condition may be evaluated as the sum of the difference $D_1(t_i)$, $D_2(t_i)$, $D_3(t_i)$ of the sensors 103-1, 103-2, 103-3 with respect to each Cartesian component separately. In this case, the threshold condition may include conditions like $|D_{1,x}(t_i)| + |D_{2,x}(t_i)| + |D_{3,x}(t_i)| \leq T_x$, and similarly for the other components. In another example, the threshold condition may be evaluated as the sum of the Cartesian components $D_x(t_i)$, $D_y(t_i)$, $D_z(t_i)$ of the difference with respect to each sensor 103-1, 103-2, 103-3 separately. In this case, the threshold condition may include the conditions like $|D_{1,x}(t_i)| + |D_{1,y}(t_i)| + |D_{1,z}(t_i)| \leq T_1$, and similarly for the other sensors. Combinations of the above-described examples are also possible. In particular, the threshold condition may include the condition $|D_{1,x}(t_i)| + |D_{1,y}(t_i)| + |D_{1,z}(t_i)| + |D_{2,x}(t_i)| + |D_{2,y}(t_i)| + |D_{2,z}(t_i)| + |D_{3,x}(t_i)| + |D_{3,y}(t_i)| + |D_{3,z}(t_i)| \leq T$.

In step 260, a compensation direction is determined. This determination may be based on the differences $D_1(t_i)$, $D_2(t_i)$, $D_3(t_i)$, or on their Cartesian components $D_{1,x}(t_i)$, $D_{1,y}(t_i)$, $D_{1,z}(t_i)$, $D_{2,x}(t_i)$, $D_{2,y}(t_i)$, $D_{2,z}(t_i)$, $D_{3,x}(t_i)$, and $D_{3,z}(t_i)$. The compensation direction may be represented by a velocity vector $V(t_i) = (V_x(t_i), V_y(t_i), V_z(t_i))$, wherein the components $V_x(t_i)$, $V_y(t_i)$, and $V_z(t_i)$ represent the velocities along the x-axis, y-axis, and z-axis, respectively, with which the sensors will be moved in step 270. Here, the signs of $V_x(t_i)$, $V_y(t_i)$, and $V_z(t_i)$ determine the direction of the movement along the respective axis, that is, a forward or backward translation, whereas their absolute value determines the speed of the translation along the respective axis. The velocity components $V_x(t_i)$, $V_y(t_i)$, $V_z(t_i)$ may be determined from the differences $D_1(t_i)$, $D_2(t_i)$, $D_3(t_i)$ as follows:

$$V_x(t_i)=K_{1,x}\cdot D_1(t_i)+K_{2,x}\cdot D_2(t_i)+K_{3,x}\cdot D_3(t_i),$$

$$V_y(t_i)=K_{1,y}\cdot D_1(t_i)+K_{2,y}\cdot D_2(t_i)+K_{3,y}\cdot D_3(t_i),$$

$$V_z(t_i)=K_{1,z}\cdot D_1(t_i)+K_{2,z}\cdot D_2(t_i)+K_{3,z}\cdot D_3(t_i),$$

The kinematic factors K are the relation between the compensation direction and the sensor movement. The factors K may be constant. In particular, the factor K of a sensor is constant when the spatial orientation of its sensor axis is fixed. Moreover, the factors K may be known, or may be determined as follows:

$$K_{1,x}=A\cdot D_{1,x}(t_i)/D_1(t_i);\ K_{1,y}=A\cdot D_{1,y}(t_i)/D_1(t_i);$$
$$K_{1,z}=A\cdot D_{1,z}(t_i)/D_1(t_i);$$

$$K_{2,x}=B\cdot D_{2,x}(t_i)/D_2(t_i);\ K_{2,y}=B\cdot D_{2,y}(t_i)/D_2(t_i);$$
$$K_{2,z}=B\cdot D_{2,z}(t_i)/D_2(t_i);$$

$$K_{3,x}=C\cdot D_{3,x}(t_i)/D_3(t_i);\ K_{3,y}=C\cdot D_{3,y}(t_i)/D_3(t_i),$$
$$K_{3,z}=C\cdot D_{3,z}(t_i)/D_3(t_i),$$

The scale A, B, and C are factors related to the constructive solution of the kinematic system that moves the sensors 103. In particular, A, B and C may represent scale factors which the control unit 105 applies when computing the movement data. This may be advantageous if the sensors 103-1, 103-2, 103-3 have different gains. The scale factors A, B and C may be the same or different. The kinematic factors, for example $K_1$, may include weight factors $D_{1,x}(t_i)/D_1(t_i)$, $D_{1,y}(t_i)/D_1(t_i)$, and $D_{1,z}(t_i)/D_1(t_i)$, representing the relative contribution of a difference component $D_{1,x}(t_i)$, $D_{1,y}(t_i)$, and $D_{1,z}(t_i)$ to the overall difference $D_1(t_i)$ of the sensor 103-1, and likewise for the other sensors. This ensures that the compensation direction $V(t_i)$, as determined above, points in a direction corresponding to the relative highest overall sensor difference and thereby is closest to the actual displacement of the ball 102 due to a positioning error of the tool head 101. If the K factors are known, a determination of the Cartesian components of the sensor data $S(t_0)$, $S(t_i)$ and/or $D(t_i)$ may be omitted. Alternatively, the K factors may be obtained by employing a reference measurement, for example, the K factors may be obtained from the first sensor data, i.e. $K_{1,x}=A\cdot S_{1,x}(t_0)/S_1(t_0)$ etc. A determination of the Cartesian components of $S(t_i)$ and/or $D(t_i)$ may then be omitted.

In step 270, the sensors 103-1, 103-2, 103-3 and/or the sensor base 104 are moved according to the velocity vector $V(t_i)=(V_x(t_i), V_y(t_i), V_z(t_i))$. That is, the sensors 103-1, 103-2, 103-3 and/or the sensor base 104 are translated along the x-axis with a velocity $V_x(t_i)$, along the y-axis with a velocity $V_y(t_i)$, and along the z-axis with a velocity $V_z(t_i)$. This results in a movement into the compensation direction which was determined in step system and, thereby, partially or fully compensates the difference $D(t_i)$. In the case when the movement element 106 includes three motors which are configured to translate the sensors 103-1, 103-2, 103-3 and/or the sensor base 104 along the three Cartesian axes, respectively, the velocity components $V_x(t_i)$, $V_y(t_i)$, and $V_z(t_i)$ may be transformed into respective control data indicating a forward/backward translation with a respective speed, and directly input into the respective motors.

The method then jumps back to step 230 where new current sensor data $S(t_{i+1})$ is read at a time $t_{i+1}>t_i$, and a new difference $D(t_{i+1})=S(t_0)-S(t_{i+1})$ is determined in step 240. Due to the fact that the kinematic factors K in the compensation direction $V(t_i)$ include weight factors, as described in step 260, the new difference $D(t_{i+1})$ will be smaller than the preceding difference $D(t_i)$, that is, $|D(t_{i+1})|<|D(t_i)|$. Therefore, the process converges in every loop. In step 250, it is checked if the difference $D(t_{i+1})$ meets the threshold value T. If the threshold value is met, the method proceeds to step 280. If the threshold value is not met, a compensation direction $V(t_{i+1})$ is determined from the difference $D(t_{i+1})$ in step 260, and the sensors 103 and/or base 104 are moved accordingly. The difference $\Delta t=t_{i+1}-t_i$ is called takt time and may, for example, be 1 ms. The takt time $\Delta t$ is preferably a constant, in particular, a pre-settable constant. However, it is also possible that the takt time $\Delta t$ is variable.

In step 280, the positioning error is determined based on the movements of the sensors 103 that were necessary to meet the threshold in step 250. The positioning error may be determined by superposing all movement data, starting with the sensor movement after reading the second sensor data. The Cartesian components (Dx, Dy, Dz) of the positioning error may be obtained by adding all components of the movement data. As an example, if n steps were necessary to meet the threshold value, that is, $|D(t_n)|\leq T$ is satisfied, the positioning error may be determined as follows:

$$Dx=(V_x(t_1)+\ldots+V_x(t_{n-1}))\cdot\Delta t,$$

$$Dy=(V_y(t_1)+\ldots+V_y(t_{n-1}))\cdot\Delta t,$$

$$Dz=(V_z(t_1)+\ldots+V_z(t_{n-1}))\cdot\Delta t.$$

Alternatively, a value $C(t_i)=(C_x(t_i), C_y(t_i), C_z(t_i))=(V_x(t_i)\cdot\Delta t, V_y(t_i)\cdot\Delta t, V_z(t_i)\cdot\Delta t)$ indicating the compensation movement may be computed and stored in every loop, for example in step 260. Then, for the above-mentioned example, the positioning error may be determined as follows:

$$Dx=C_x(t_1)+\ldots+C_x(t_{n-1}), Dy=C_y(t_1)+\ldots+C_y(t_{n-1}), Dz=C_z(t_1)+\ldots+C_z(t_{n-1}).$$

Alternatively, the value $C(t_i)$ indicating the compensation movement may be determined recursively, that is, $C(t_i)=C(t_{i-1})+V(t_i)\cdot\Delta t$, in every loop, for example in step 260. Then, for the above-mentioned example, the positioning error may be determined as $$Dx=C_x(t_{n-1}), Dy=C_y(t_{n-1}), Dz=C_z(t_{n-1}).$$

Since the positioning error is determined from data corresponding to all movements of the sensors 103-1, 103-2, 103-3 which were necessary to meet the threshold condition, the sensor values $S_1$, $S_2$, and $S_3$ need not be very precise. In fact, the method may work as long as, at least at some point t, the differences converge, that is $|D(t_{i+1})|<|D(t_i)|$ holds for all $t_i>t$ until the threshold condition is met. This way, even detrimental influences, like jolts or vibrations which may break the convergence temporarily, may not affect the result of the method.

Figure 2B:
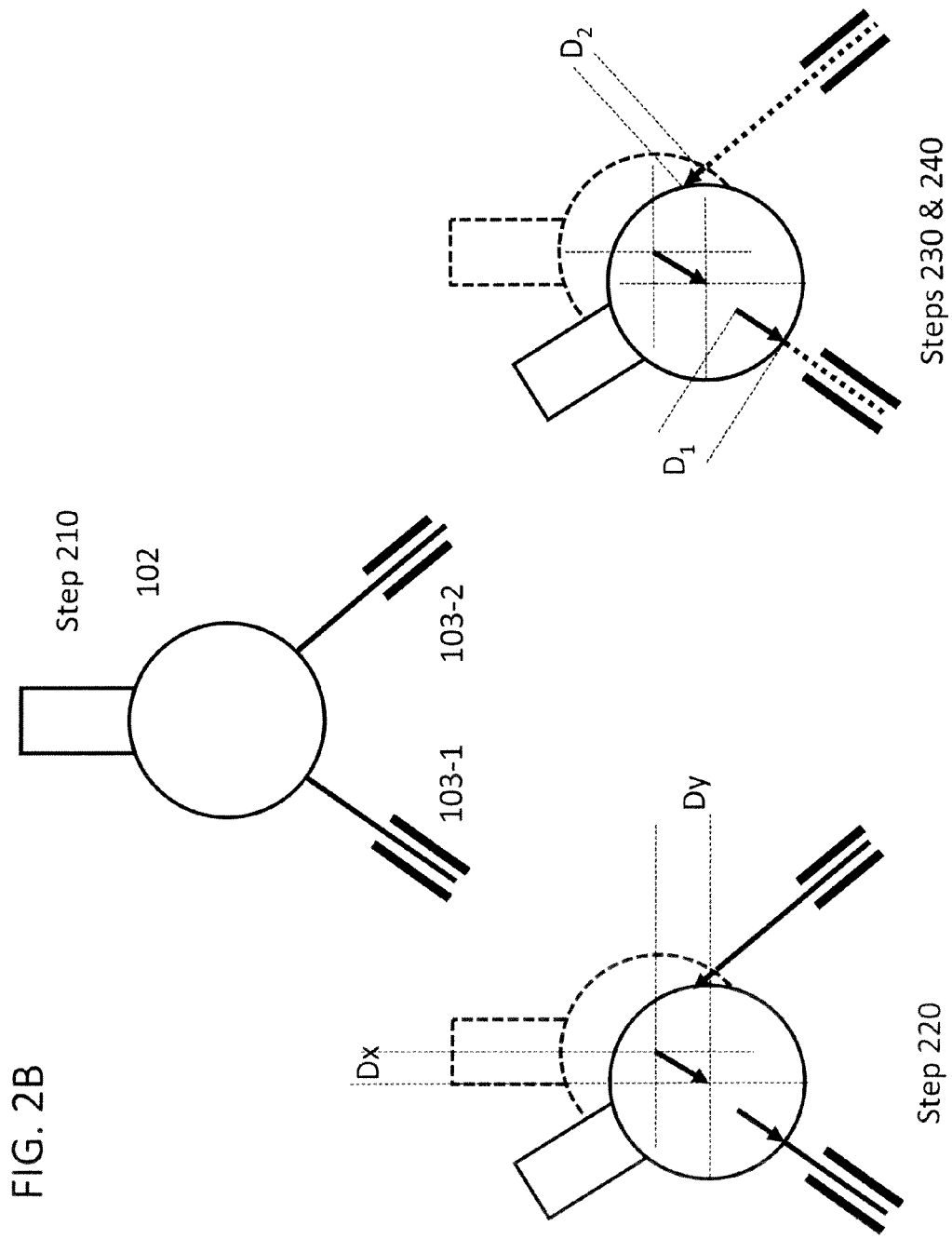
FIG. 2B shows the positioning error of the calibration element and the according sensor deflections in a two-dimensional Cartesian example.

FIG. 2B illustrates the position of the calibration element 102 and the deflection of the sensors 103 in the case of two sensors 103-1 and 103-2 in two dimensions. A generalization to the case of three or more sensors is obvious. A generalization to the case of two sensors in three dimensions is also obvious.

In step 210, the calibration element 102 is in its first position, say (0, 0), and the sensors 103-1 and 103-2 provide first sensor data corresponding to the first position of the calibration element 102.

In step 220, the calibration element 102 is moved as discussed hereinbefore. In particular, according to the CNC control, the calibration element 102 is in the same position as in step 210, that is, at (0, 0). Due to a positioning error of the CNC machine, however, the calibration element is now at a point (Dx, Dy).

Figure 2C:
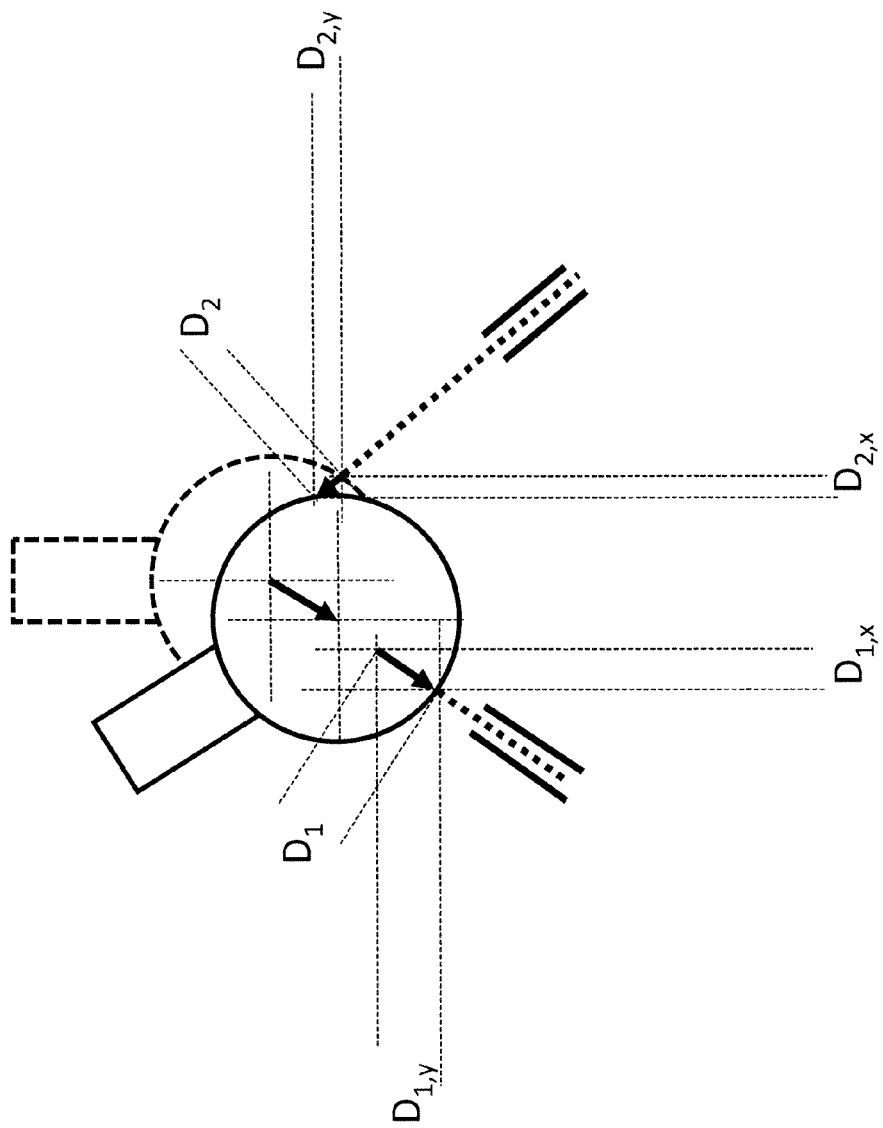
FIG. 2C shows the components of the differences between the first and current sensor data in a two-dimensional Cartesian example.

In step 230, second sensor data is read from the sensors 103-1 and 103-2 and, in step 240, the differences $D_1$ and $D_2$ between the first and second sensor data of the sensors 103-1, and 103-2, respectively, is determined. The differences $D_1$ and $D_2$ represent the displacement vectors of the contact elements of the sensors 103-1, 103-2, respectively. The Cartesian components $D_{1,x}$, $D_{1,y}$, $D_{2,x}$ and $D_{2,y}$ of $D_1$ and $D_2$ are depicted in FIG. 2C. However, a determination of $D_{1,x}$, $D_{1,y}$, $D_{2,x}$ and $D_{2,y}$ may be omitted if the spatial orientations of the sensor axes are fixed, that is, if the directions which the sensors point to are not changed during the procedure.

Figure 2D:
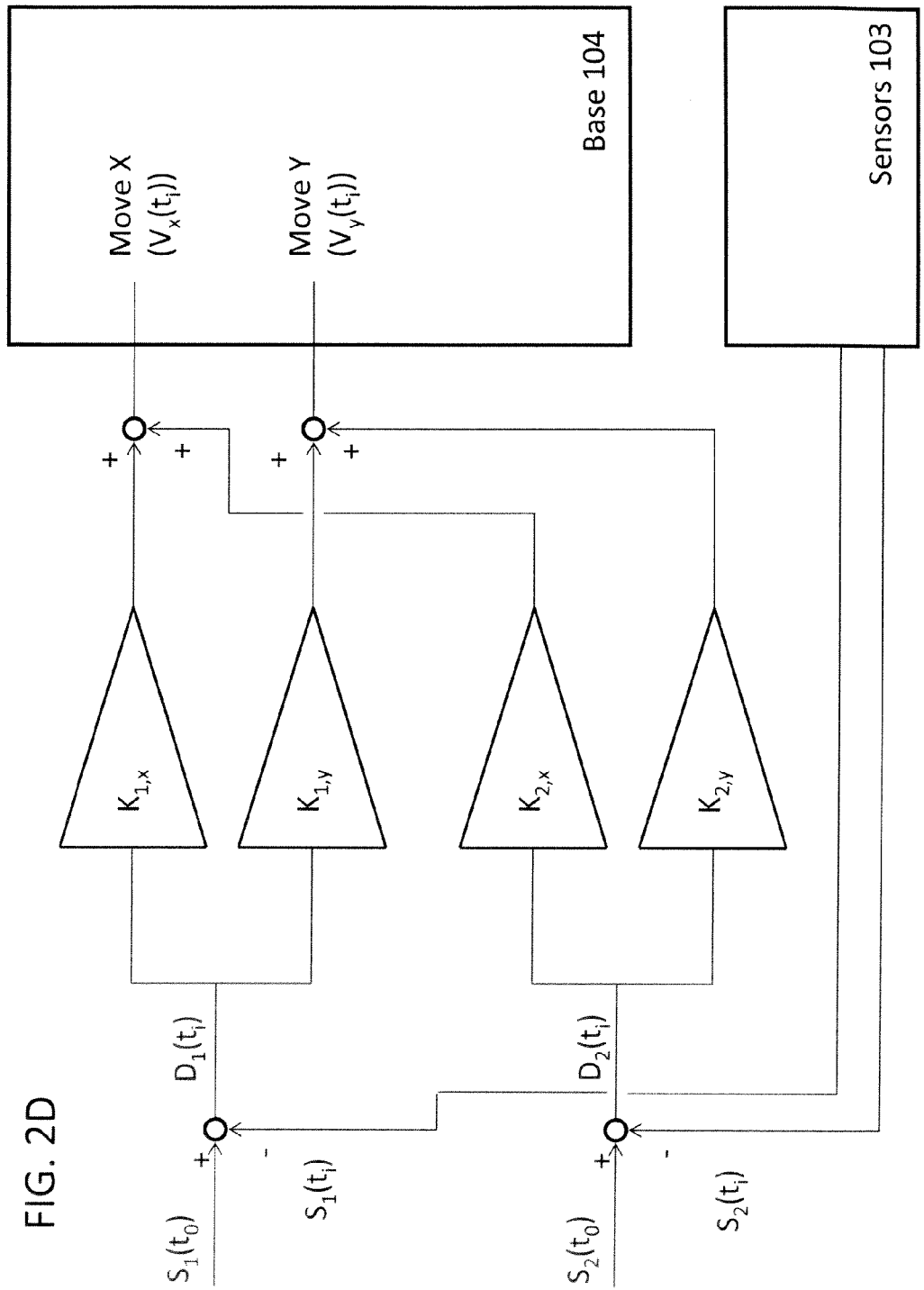
FIG. 2D shows an example for an algorithm in a two-dimensional Cartesian example.

FIG. 2D illustrates an example of an algorithm for the example with two sensors 103-1 and 103-2. From the stored first sensor values $S_1(t_0)$, $S_2(t_0)$ and the current sensor values $S_1(t_i)$, $S_2(t_i)$ the differences $D_1(t_i)$ and $D_2(t_i)$ are computed for the sensors 103-1 and 103-2, respectively, as described hereinbefore. Then, from the difference $D_1(t_i)$, $D_2(t_i)$ and the known factors $K_{1,x}$, $K_{2,x}$ the x-component $V_x(t_i)$ of the velocity vector $V(t_i)$ is determined as $V_x(t_i)=K_{1,x} \cdot D_1(t_i) + K_{2,x} \cdot D_2(t_i)$, and, analogously, from the difference $D_1(t_i)$, $D_2(t_i)$ and the factors $K_{1,y}$, $K_{2,y}$ the y-component $V_y(t_i)$ of the velocity vector $V(t_i)$ is determined as $V_y(t_i)=K_{1,y} \cdot D_1(t_i) + K_{2,y} \cdot D_2(t_i)$. Then, in this loop, that is, for the duration of the takt time $\Delta t$, a first motor configured to translate the base 104 along the x-axis may be operated to translate the base 104 along the x-axis with the velocity $V_x(t_i)$, and a second motor configured to translate the base 104 along the y-axis may be operated to translate the base 104 along the y-axis with the velocity $V_y(t_i)$, wherein the signs of $V_x(t_i)$ and $V_y(t_i)$ determine a forward or backward translation along the respective axis, and the absolute values of $V_x(t_i)$ and $V_y(t_i)$ determine the speed of the respective forward/backward translation.

The present embodiments may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof. In a typical embodiment of the present invention, predominantly all of the described logic is implemented as a set of computer program instructions that is converted into a computer executable form, stored as such in a computer readable medium, and executed by a microprocessor under the control of an operating system.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies, networking technologies, and internetworking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web). Of course, some embodiments of the invention may be implemented as a combination of both software (e.g., a computer program product) and hardware. Still other embodiments of the invention are implemented as entirely hardware, or entirely software.

What is claimed includes:

1. A method for determining a positioning error of a computerized numerical control (CNC) machine, wherein the CNC machine is equipped with a calibration element, the calibration element being in a first position, the method comprising the steps of:

reading first sensor data from at least one sensor while the calibration element is at the first position, the sensor data corresponding to a distance associated with the calibration element;

operating the CNC machine to perform a calibration movement while the calibration element remains generally at the first position;

reading second sensor data from the at least one sensor while the calibration element is at a second position, the second position denoting the actual position of the calibration element after the calibration movement has been performed;

causing the at least one sensor to move so that the difference between the first and second sensor data decreases until the difference becomes less than or equal to a pre-determined threshold value, wherein the at least one sensor comprises or is mounted to a movement element for moving the at least one sensor; and determining a positioning error of the CNC machine based on the movement of the at least one sensor.

2. The method according to claim 1 further comprising: determining, from the first and second sensor data, including the difference thereof, a first compensation direction, in such a way that a movement of the at least one sensor in the first compensation direction decreases the difference between the first and second sensor data; and causing the at least one sensor to move in the first compensation direction.

3. The method according to claim 2 further comprising performing a closed loop comprising the steps of:

reading current sensor data from at least one sensor;

determining, from the first and current sensor data, including from the difference thereof, a current compensation direction, in such a way that a movement of the at least one sensor in the current compensation direction decreases the absolute difference between the first and second sensor data; and causing the at least one sensor to move in the current compensation direction.

4. The method according to claim 2, wherein determining the first compensation direction comprises transforming the sensor data into components with respect to a pre-determined coordinate system, including an orthogonal coordinate system.

5. The method of claim 4, wherein reading at least one of the first, second, and current sensor data comprises reading from at least two sensors, and wherein determining the first compensation direction comprises determining components of a velocity vector with respect to the pre-determined coordinate system, including an orthogonal coordinate system, so that a corresponding movement of the at least one sensor decreases the absolute difference between the first and current sensor data.

6. The method according to claim 1, wherein the threshold value is expressed in terms of the coordinate system, including at least one of i) terms of components with respect to the coordinate system and ii) terms of the sensor data.

7. The method according to claim 1 further comprising outputting data indicating the positioning error of the tool head, including at least one of one of displaying, printing, transmitting, and saving the data.

8. A method for improving the accuracy of a computerized numerical control (CNC) machine, the method comprising:

reading first sensor data from at least one sensor while the calibration element is at the first position, the sensor data corresponding to a distance associated with the calibration element;

operating the CNC machine to perform a calibration movement while the calibration element remains generally at the first position;

reading second sensor data from the at least one sensor while the calibration element is at a second position, the second position denoting the actual position of the calibration element after the calibration movement has been performed;

causing the at least one sensor to move so that the difference between the first and second sensor data decreases until the difference becomes less than or equal to a pre-determined threshold value, wherein the at least one sensor comprises or is mounted to a movement element for moving the at least one sensor; and determining a positioning error of the CNC machine based on the movement of the at least one sensor; and compensating the positioning error of a tool head.

9. A system for determining a positioning error of a computerized numerical control (CNC) machine, wherein the CNC machine is equipped with a calibration element, the system comprising:

at least one sensor configured to output sensor data, the sensor data corresponding to a distance associated with the calibration element;

a movement element configured to move the at least one sensor; and a control unit configured to processing the sensor data received from the at least one sensor, and for controlling the movement element, wherein the control unit is configured to:

receive first and second sensor data;

output movement data to the movement element causing the movement element to move the at least one sensor so that the difference between the first and second sensor data decreases until the difference becomes less than or equal than a threshold value wherein the at least one sensor comprises or is mounted to a movement element for moving the at least one sensor; and determine a positioning error of the tool head based on the movement of the at least one sensor.

10. The system according to claim 9 further comprising an output unit configured to output error data corresponding to the positioning error of the CNC machine, wherein outputting comprises at least one of displaying, printing, transmitting and saving the error data.

11. The system according to claim 9, wherein at least one sensor is a contact point sensor, a dial indicator, a light sensor, a laser sensor, an ultrasonic sensor, a capacitive sensor, or an inductive sensor.

12. The system according to claim 9, wherein the movement element comprises at least one motor, including at least one of an electric motor and a linear actuator.

13. The system according to claim 9, wherein the movement element moves the at least one sensor by translation along at least one coordinate axis of a coordinate system.

14. The system according to claim 9, wherein the movement element comprises at least two motors, wherein the at least two motors may be controlled separately, wherein the movement element moves the at least one sensor by translation along at least two coordinate axis of the coordinate system separately.

15. The system according to claim 9, wherein the movement element moves at least two sensors together, including sensors fixed to a common support base.

16. The system according to claim 9, wherein three sensors are fixed at the edges of an imaginary triangle formed parallel to a surface of the support base, wherein each of the sensors is directed to the center of the triangle and inclined against the surface of the support base.

17. The system according to claim 9, wherein the calibration element comprises a ball.

18. The system according to claim 9, wherein the control unit is further configured to
determine, from the first and second sensor data, including the difference thereof, a first compensation direction, in such a way that a movement of the at least one sensor in the first compensation direction decreases the difference between the first and second sensor data; and
cause the at least one sensor to move in the first compensation direction.

19. The system according to claim 18, wherein the control unit determines the first compensation direction by determining components of a velocity vector with respect to the pre-determined coordinate system so that a corresponding movement of the at least one sensor decreases the absolute difference between the first and current sensor data.

20. The system according to claim 9, wherein the control unit is further configured to
read current sensor data from at least one sensor;
determine, from the first and current sensor data, including from the difference thereof, a current compensation direction, in such a way that a movement of the at least one sensor in the current compensation direction decreases the absolute difference between the first and second sensor data; and
cause the at least one sensor to move in the current compensation direction.

21. A computer program product, which is stored on a non-transitory machine-readable medium containing computer instructions stored therein for causing a computer processor to perform determining a positioning error of a computerized numerical control (CNC) machine, wherein the CNC machine is equipped with a calibration element, the calibration element being in a first position, the computer program product comprising:
computer code to read first sensor data from at least one sensor while the calibration element is at the first position, the sensor data corresponding to a distance associated with the calibration element;
computer code to operate the CNC machine to perform a calibration movement while the calibration element remains generally at the first position;
computer code to read second sensor data from the at least one sensor while the calibration element is at a second position, the second position denoting the actual position of the calibration element after the calibration movement has been performed;
computer code to cause the at least one sensor to move so that the difference between the first and second sensor data decreases until the difference becomes less than or equal to a pre-determined threshold value, wherein the at least one sensor comprises or is mounted to a movement element for moving the at least one sensor; and
computer code to determine a positioning error of the CNC machine based on the movement of the at least one sensor.

* * * * *